United States Patent
Larson, III et al.

(10) Patent No.: US 8,673,121 B2
(45) Date of Patent: Mar. 18, 2014

(54) METHOD OF FABRICATING PIEZOELECTRIC MATERIALS WITH OPPOSITE C-AXIS ORIENTATIONS

(75) Inventors: John D. Larson, III, Palo Alto, CA (US); Jyrki Kaitila, Riemerling (DE); Stefan Bader, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 104 days.

(21) Appl. No.: 13/428,474

(22) Filed: Mar. 23, 2012

(65) Prior Publication Data

US 2012/0177816 A1 Jul. 12, 2012

Related U.S. Application Data

(63) Continuation-in-part of application No. 12/692,108, filed on Jan. 22, 2010, and a continuation-in-part of application No. 13/286,051, filed on Oct. 31, 2011.

(51) Int. Cl.
*C23C 14/35* (2006.01)

(52) U.S. Cl.
USPC .............. 204/192.18; 204/192.12; 310/311; 427/100

(58) Field of Classification Search
USPC .......... 204/192.15, 192.12; 310/311; 427/100
See application file for complete search history.

(56) References Cited

U.S. PATENT DOCUMENTS

| | | | |
|---|---|---|---|
| 5,587,620 A | 12/1996 | Ruby et al. | |
| 5,873,153 A | 2/1999 | Ruby et al. | |
| 6,060,818 A | 5/2000 | Ruby et al. | |
| 6,099,700 A | 8/2000 | Lee | |
| 6,107,721 A | 8/2000 | Lakin | |
| 6,507,983 B1 | 1/2003 | Ruby et al. | |
| 6,927,651 B2 | 8/2005 | Larson, III et al. | |
| 6,987,433 B2 | 1/2006 | Larson, III et al. | |
| 7,091,649 B2 | 8/2006 | Larson, III et al. | |
| 7,161,448 B2 | 1/2007 | Feng et al. | |
| 7,280,007 B2 | 10/2007 | Feng | |
| 7,369,013 B2 | 5/2008 | Fazzio et al. | |
| 7,388,454 B2 | 6/2008 | Ruby et al. | |
| 7,420,320 B2 | 9/2008 | Sano et al. | |
| 7,515,018 B2 | 4/2009 | Handtmann et al. | |
| 7,629,865 B2 | 12/2009 | Ruby | |
| 7,642,693 B2 | 1/2010 | Akiyama et al. | |
| 7,791,434 B2 | 9/2010 | Fazzio et al. | |
| 7,889,024 B2 | 2/2011 | Bradley et al. | |
| 2002/0190814 A1 | 12/2002 | Yamada et al. | |
| 2003/0155574 A1 | 8/2003 | Doolittle | |
| 2007/0205850 A1 | 9/2007 | Jamneala et al. | |
| 2010/0013573 A1 | 1/2010 | Umeda | |
| 2010/0052815 A1 | 3/2010 | Bradley et al. | |

(Continued)

OTHER PUBLICATIONS

Chen, "Fabrication and Characterization of ALN Thin Film Bulk Acoustic Wave Resonator", Dissertation, University of Pittsburgh School of Engineering, 2006.

(Continued)

*Primary Examiner* — Keith Hendricks
*Assistant Examiner* — Jason M Berman

(57) ABSTRACT

In accordance with a representative embodiment, a method, comprises: providing a substrate; forming a first piezoelectric layer having a compression-negative ($C_N$) polarity over the substrate; and forming a second piezoelectric layer having a compression-positive ($C_P$) over the substrate and adjacent to the first piezoelectric layer.

21 Claims, 11 Drawing Sheets

(56) References Cited

U.S. PATENT DOCUMENTS

| | | |
|---|---|---|
| 2010/0327697 A1 | 12/2010 | Choy et al. |
| 2010/0327994 A1 | 12/2010 | Choy et al. |
| 2011/0121689 A1* | 5/2011 | Grannen et al. .............. 310/357 |
| 2011/0180391 A1 | 7/2011 | Larson, III et al. |
| 2011/0204997 A1 | 8/2011 | Elbrecht et al. |
| 2011/0266917 A1 | 11/2011 | Metzger et al. |

OTHER PUBLICATIONS

Martin, et al. "Re-growth of c-axis oriented AlN thin films", IEEE Ultrasonics Symposium, 2006, p. 169-172.

Martin, et al. "Shear Mode Coupling and Tilted Gram Growth of AlN Thin Films in BAW Resonators", IEEE Transactions on Ultrasonics, Ferroelectrics, and Frequency Control, Jul. 2006, p. 1339-1343, vol. 53, No. 7.

Pensala, et al. "Spurious Resonance Suppression in Gigahertz-Range ZnO Thin-Film Bulk Acoustic Wave Resonators by the Boundary Frame Method: Modeling and Experiment," IEEE Transactions on Ultrasonics, Ferroelectrics, and Frequency Control, vol. 56, No. 8, Aug. 2009, p. 1731-1744.

Co-pending U.S. Appl. No. 13/074,094, filed Mar. 29, 2011.
Co-pending U.S. Appl. No. 13/036,489, filed Feb. 28, 2011.
Co-pending U.S. Appl. No. 13/101,376, filed May 5, 2011.
Co-pending U.S. Appl. No. 13/074,262, filed Mar. 29, 2011.
Co-pending U.S. Appl. No. 13/161,946, filed Jun. 16, 2011.

* cited by examiner

METHOD OF FABRICATING PIEZOELECTRIC MATERIALS WITH OPPOSITE C-AXIS ORIENTATIONS

CROSS-REFERENCE TO RELATED APPLICATIONS

The present application is a continuation-in-part application under 37 C.F.R. §1.53(b) of commonly owned U.S. patent application Ser. No. 12/692,108 to John L. Larson, et al, entitled "Method of Fabricating a Piezoelectric Material with Selected C-Axis Orientation," and filed on Jan. 22, 2010. The present application is also a continuation-in-part application under 37 C.F.R. §1.53(b) of commonly owned U.S. patent application Ser. No. 13/286,051 to Dariusz Burak et al., entitled "Bulk Acoustic Resonator Comprising Piezoelectric Layer and Inverse Piezoelectric Layer," filed on Oct. 31, 2011. Applicants claim priority under 35 U.S.C. §120 from U.S. patent application Ser. No. 12/692,108, and from U.S. patent application Ser. No. 13/286,051. The entire disclosure of U.S. patent application Ser. No. 12/692,108 and the entire disclosure of U.S. patent application Ser. No. 13/286,051 are specifically incorporated herein by reference.

BACKGROUND

In many electronic applications, electrical resonators are used. For example, in many wireless communications devices, radio frequency (RF) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a Bulk Acoustic Wave (BAW) resonator. The BAW resonator includes an acoustic stack comprising, inter alia, a layer of piezoelectric material disposed between two electrodes. Acoustic waves achieve resonance across the acoustic stack, with the resonant frequency of the waves being determined by the materials in the acoustic stack. One type of RAW resonator comprises a piezoelectric film for the piezoelectric material. These resonators are often referred to as Film Bulk Acoustic Resonators (FBAR).

FBARs are similar in principle to bulk acoustic resonators such as quartz, but are scaled down to resonate at GHz frequencies. Because the FBARs have thicknesses on the order of microns and length and width dimensions of hundreds of microns, FBARs beneficially a comparatively compact alternative to certain known resonators.

FRARs may comprise a membrane (also referred to as the acoustic stack) disposed over air. Often, such a structure comprises the membrane suspended over a cavity provided in a substrate over which the membrane is suspended. Other FBARs may comprise the membrane formed over an acoustic mirror formed in the substrate. Regardless of whether the membrane is formed over, air or over an acoustic mirror, the membrane comprises a piezoelectric layer disposed over a first electrode, and a second electrode disposed aver the piezoelectric layer.

The piezoelectric layer comprises a crystalline structure and a polarization axis. Piezoelectric materials either compress or expand upon application of a voltage. By convention, a piezoelectric material that compresses when a voltage of a certain polarity is applied is referred to as a compression-positive ($C_P$) material, whereas a piezoelectric material that expands upon application of the voltage is referred to as a compression-negative ($C_N$) material. The polarization axis of $C_P$ piezoelectric materials is antiparallel to the polarization axis of $C_N$ materials.

An FBAR is a polarity-dependent device as a result of polarity dependence of the piezoelectric material that constitutes part of the FBAR. A voltage of a given polarity applied between the electrodes of the FBAR will cause the thickness of the FBAR to change in first direction, whereas the same voltage of the opposite polarity will cause the thickness of the FBAR to change in a second direction, opposite the first direction. (The thickness of the FBAR is the dimension of the FBAR between the electrodes.) For example, a voltage of the given polarity will cause the thickness of the FBAR to increase, whereas a voltage of the opposite polarity will cause the FBAR to decrease. Similarly, a mechanical stress applied to the FBAR that causes the thickness of the FBAR to change in a first direction will generate a voltage of the given polarity between the electrodes of the FBAR, whereas a mechanical stress that causes the thickness of the FBAR to change in a second direction, opposite the first direction, will generate a voltage of the opposite polarity between the electrodes of the FBAR. As such, a mechanical stress applied to the FBAR that causes the thickness of the FBAR to increase will generate a voltage of the given polarity, whereas a mechanical stress that causes the thickness of the FBAR to decrease will generate a voltage of the opposite polarity.

The piezoelectric layer of an FBAR is often grown over a first electrode and beneath a second electrode. The orientation of the C-axis can be governed by the first layer formed over the first electrode. For example, in growing aluminum nitride (AlN) with a $C_P$ film orientation, the formation of a native oxide layer over the first electrode (e.g., Mo) is believed to cause the first layer of the piezoelectric crystal to be Al. Ultimately, the crystalline orientation of the AlN formed results in the piezoelectric film's having $C_P$ orientation and its attendant properties. Growth of $C_N$ piezoelectric layers (e.g., AlN) by known methods has proven to be more difficult. It is believed that nitrogen and oxygen may be adsorbed at the surface of the first electrode, with the forming of a layer of Al over this adsorbed material. As such, rather than forming the desired $C_N$ piezoelectric layer, $C_P$ piezoelectric material is formed.

In certain applications, it is desirable to be able to select the orientation of the piezoelectric material, and to fabricate both $C_P$ piezoelectric material and $C_N$ piezoelectric material on the same substrate. For example, in certain applications it is useful to provide a single-ended input to a differential output. One known resonator structure having a differential output comprises coupled mode resonators. Filters based on coupled mode acoustic resonators are often referred to as coupled resonator filters (CRFs). CRFs have been investigated and implemented to provide improved passband and isolation of the transmit band and receive band of duplexers, for example. One topology for CRFs comprises an upper FBAR and a lower FBAR. The two electrodes of one of the FBARs comprise the differential outputs, and one of the inputs to the lower resonator provides the single-ended input. The second electrode provides the ground for the device. However, while the stacked-FBAR CRF shows promise from the perspective of improved performance and reduced area or footprint due to its vertical nature, in order to attain this structure, the orientation of the compression axes (C-axes) of individual piezoelectric materials must be tailored to the application. For example, it may be useful to have one piezoelectric layer with its C-axis e.g., $C_N$) in one direction, and the second piezoelectric layer to have its crystalline orientation anti-parallel (e.g., $C_P$) to the C-axis of the first piezoelectric layer.

In other applications, it may be useful to provide one piezoelectric layer with its C-axis $C_p$, "piezoelectric (p) layer") in one direction, and the second piezoelectric layer to have its crystalline orientation anti-parallel (e.g., $C_P$, "inverse-piezoelectric (ip) layer) to the C-axis of the p-layer. Unfortunately, and as alluded to above, using certain known methods of fabricating piezoelectric layers, it is difficult to fabricate a p-layer and ip-layer, especially on the same wafer.

What is needed, therefore, is a method of fabricating piezoelectric materials that overcomes at least the known shortcomings described above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIGS. 3A-11 are cross-sectional views illustrating methods of fabricating piezoelectric layers over a substrate in accordance with representative embodiments.

DEFINED TERMINOLOGY

Figure 1:
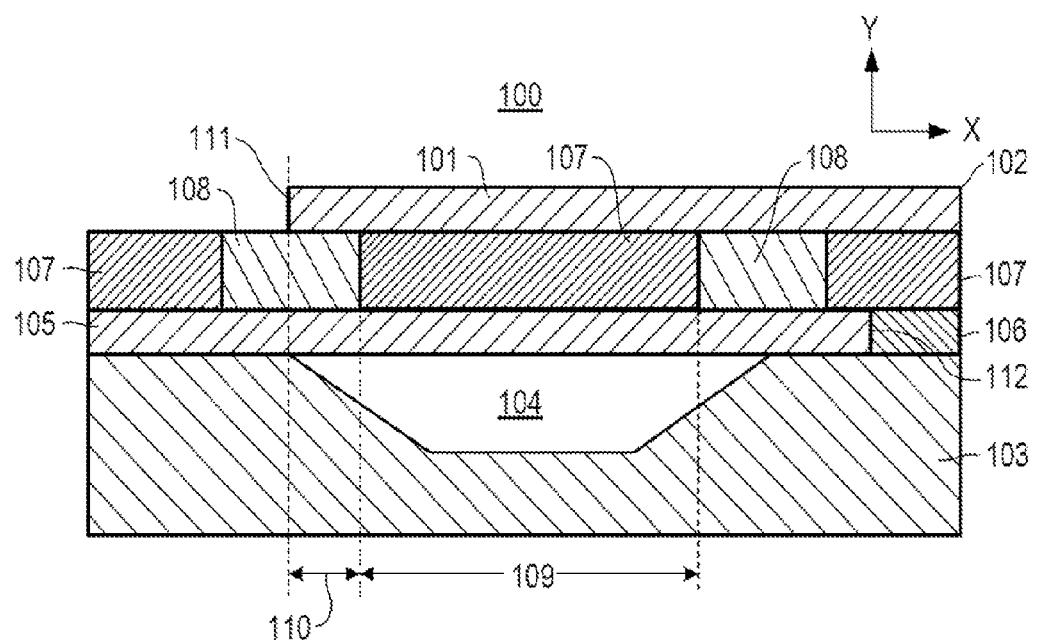
FIG. 1 shows a cross-sectional view of an FBAR in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

As used in the specification and appended claims, and in addition to its ordinary meaning, the term 'adjacent' means immediately next to and in contact with, or next to but not in contact with (e.g., separated by an intermediate layer(s)). For example, "a first layer adjacent to a second layer" means that the first layer is immediately next to and in touch with the second layer, or that the first layer is next to the second layer but not in contact with the second layer (e.g., the first layer is next to the second layer, but separated by an intermediate layer(s)).

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not Obscure the description of the illustrative embodiments. Such methods and apparatuses are clearly within the scope of the present teachings.

Notably, the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

Generally, the present teachings relate to a method of fabricating piezoelectric layers having opposite C-axis orientations (i.e., polarity) over the same substrate. In certain embodiments a first piezoelectric material fabricated according to representative embodiments comprises a $C_N$ polarity (also referred to as type-$C_N$ piezoelectric material), whereas a second piezoelectric material fabricated over the same substrate comprises a $C_P$ polarity (also referred to as type-$C_P$ piezoelectric material). As described more fully below, the two piezoelectric materials are formed using the same processing parameters (sometime referred to as a "recipe") and are formed substantially simultaneously over their common substrate. In representative embodiments described below, illustrative conditions, materials and methods are described that are useful to the fabrication of a piezoelectric material comprising AlN and variants thereof that are within the purview of one of ordinary skill in the alt. It is noted that this is merely illustrative, and other piezoelectric materials and variants thereof within the purview of one of ordinary skill in the art are also contemplated. For example, zinc oxide (ZnO) can be fabricated in accordance with the present teachings through selection of suitable conditions, materials and methods.

The type-$C_N$ and type-$C_P$ piezoelectric materials fabricated in accordance with the present teachings are highly textured C-axis piezoelectric materials that demonstrate excellent piezoelectric properties. Beneficially, in a highly textured C-axis piezoelectric material, the C-axis orientations of the crystals of the piezoelectric material are well-collimated, and as such are parallel with one another and perpendicular to the plane of electrodes over which the piezoelectric material is formed.

In representative embodiments, an electronegative layer is provided over one portion of an electrode, and an electropositive surface is created over another portion of the electrode using a cleaning sequence. Both type-$C_P$ piezoelectric material and type-$C_N$ piezoelectric material are then grown substantially simultaneously in the same piezoelectric deposition chamber and under conditions conducive to the formation of type $C_N$ ("$C_N$ recipe").

In other representative embodiments, a seed layer useful in the growth of type-$C_P$ piezoelectric material is provided over a portion of an electrode, and a seed layer useful in the growth of type-C piezoelectric material is provided over another portion of the electrode. An initial thickness of type-$C_P$ piezoelectric material and an initial thickness of type-$C_N$ piezoelectric material are grown over a common substrate. After a cleaning sequence, type-$C_P$ piezoelectric material and type-$C_N$ piezoelectric material are grown substantially simultaneously in the same piezoelectric deposition chamber under conditions conducive to the formation of type $C_P$ piezoelectric material ("$C_P$ recipe").

In still other representative embodiments, a seed layer useful in the growth of type-$C_N$ piezoelectric material is provided over a portion of an electrode. A cleaning sequence is effected, and the seed layer useful in the growth of type-$C_N$ piezoelectric material is activated. After the activation sequence, type-$C_P$ piezoelectric material and type-$C_N$ piezoelectric material are grown substantially simultaneously in the same piezoelectric deposition chamber under conditions conducive to the formation of type $C_P$ piezoelectric material ("$C_P$ recipe")

Certain aspects of the present teachings are relevant to components of FBAR devices, FBAR-based filters, their materials and their methods of fabrication. Many details of FBARs, materials thereof and their methods of fabrication may be found in one or more of the following U.S. patents and patent Publications: U.S. Pat. No. 6,107,721, to Lakin; U.S. Pat. Nos. 5,587,620, 5,873,153 and 6,507,983 to Ruby, et al.; U.S. Pat. No. 7,629,865 to Richard C. Ruby, et al.; U.S. Pat. No. 7,280,007 to Hongjun Fen, et al.; U.S. Patent Publication No. 20070205850 to Jamneala, et al.; and U.S. Pat. No. 7,388,454 to Richard C. Ruby, et al. The disclosures of these patents and patent publications are specifically incorporated herein by reference. It is emphasized that the components, materials and method of fabrication described in these patents and patent publications are representative and other methods of fabrication and materials within the purview of one of ordinary skill in the art are contemplated.

Applications of the illustrative methods will be appreciated by one having ordinary skill in the art. Some of these applications include FBARs useful in transformer applications and FBARs useful in filter applications. For example, the method of fabrication of piezoelectric materials comprising antiparallel C-axes (e.g., $C_N$ polarity and $C_P$ polarity) may be useful on the fabrication of film acoustic transformers, such as described in commonly owned U.S. Pat. Nos. 6,987,433 and 7,091,649, to Larson, et al. Moreover, the method of fabrication of piezoelectric materials comprising antiparallel C-axes (e.g., $C_N$ polarity and $C_P$ polarity) or parallel C-axes (e.g., both $C_N$ polarity) may be useful in the fabrication of FBARs and stacked thin film bulk acoustic resonators (SBARs). SBARs comprise stacking two or more layers of piezoelectric material with electrodes between the piezoelectric layers and on the top and bottom of the stack. Such SBARs are described, for example in commonly owned U.S. Pat. Nos. 5,587,620 and 6,060,818, to Ruby, et al. Furthermore, the method of fabricating piezoelectric materials comprising antiparallel C-axes (e.g., $C_N$ polarity and $C_P$ polarity) or both comprising $C_N$ polarity piezoelectric material, or both comprising $C_N$ polarity piezoelectric material may be useful in CRF applications, such as described in commonly-owned U.S. Pat. No. 7,889,024 to Bradley, et al.; and in commonly owned U.S. Pat. No. 7,515,018 to Handtmann, et al. The disclosures of U.S. Pat. Nos. 5,587,620; 6,060,818; 6,987,433; 7,091,649; 7,515,018; and 7,889,024 are specifically incorporated herein by reference. It is emphasized that the noted applications are intended merely to illustrate applications of the methods of the present teachings, and that the application of the methods of fabricating piezoelectric materials of the present teachings are not limited to these illustrative applications.

Moreover, the method of fabrication of piezoelectric materials comprising antiparallel C-axes (e.g., $C_N$ polarity and $C_P$ polarity) or parallel C-axes (e.g., both $C_N$ polarity) in accordance with the present teachings may be useful in the fabrication of FBARs, SBARs and CRFs as disclosed in U.S. patent application Ser. No. 13/286,051 to Burak, et al.

FIG. 1 shows a cross-sectional view of FBAR 100 in accordance with a representative embodiment. The FBAR 100 comprises a top electrode 101 (referred to below as second electrode 101), illustratively comprising five (5) sides, with a connection side 102 configured to provide the electrical connection to an interconnect (not shown). The interconnect provides electrical signals to the top electrode 101 to excite desired acoustic waves in piezoelectric layers of the FBAR 100.

A substrate 103 comprises a cavity 104 or other acoustic reflector (e.g., a distributed Bragg grating (DBR) (not shown)). A first electrode 105 is disposed over the substrate 103 and is suspended over the cavity 104. A planarization layer 106 is provided over the substrate 103 and may be non-etchable borosilicate glass (NEBSG). In general, planarization layer 106 does not need to be present in the structure (as it increases overall processing cost), but when present, it may serve to improve the quality of growth of subsequent layers (e.g., highly textured c-axis piezoelectric material), improve the performance of the FBAR 100 through the reduction of "dead" resonator (FBAR) regions and simplify the fabrication of the various layers of the FBAR 100. Additionally, as described more fully below, a barrier layer (not shown in FIG. 1) is provided between the substrate 103 and the first electrode 105.

A first piezoelectric layer 107 is provided over the first electrode 105, and comprises highly-textured c-axis piezoelectric material such as aluminum nitride (AlN) or zinc oxide (ZnO). The c-axis of the first piezoelectric layer 107 is oriented along a first direction parallel to the +y-direction in the coordinate system depicted in FIG. 1B). The first piezoelectric layer 107 may be referred to herein as the "p" layer, or type $C_p$ piezoelectric layer. A second piezoelectric layer 108 adjacent to the first piezoelectric layer has a second c-axis oriented in a second direction (e.g., parallel to the −y-direction in the coordinate system depicted in FIG. 1B) that is substantially antiparallel to the first direction. The second piezoelectric layer 108 may be referred to herein as the "inverse-piezoelectric (ip)" or Type $C_N$ piezoelectric layer. In representative embodiments, the first piezoelectric layer 107 has a thickness (y-direction in the coordinate system of FIG. 1B) that is substantially identical to that of the second piezoelectric layer 108.

The crystals of the both the first piezoelectric layer 107 (p-layer) and the second piezoelectric layer 108 (ip-layer) grow in columns that are perpendicular to the plane of the electrodes. As such, the c-axis orientations of crystals of the first piezoelectric layer 107 are substantially aligned with one another and the c-axis orientations of crystals of the second piezoelectric layer 108 are substantially aligned with one another land are antiparallel to the c-axis orientations of crystals of the first piezoelectric layer 107. The first piezoelectric layer 107 and the second piezoelectric layer 108 are typically made from the same substance (e.g. AlN or ZnO). The second electrode 101 is disposed over the first piezoelectric layer 107 and over the second piezoelectric layer 108.

In the representative embodiment depicted in FIG. 1, the first piezoelectric layer 107 and the second piezoelectric layer 108 are disposed adjacent to each other, and in this specific embodiment, in contact with each other. As should be appreciated by one of ordinary skill in the art, in certain applications (e.g., in certain structures described in U.S. patent application Ser. No. 13/286,051 to Burak, et al. and referenced above), it is useful if not required to have the first piezoelectric layer 107 and the second piezoelectric layer 108 immediately next to and in contact with each other. In other applications (e.g., to provide a single-ended input to a differential output), the first piezoelectric layer 107 and the second piezoelectric layer 108 may be next to each other, having another material, or air, disposed between the first piezoelectric layer 107 and the second piezoelectric layer 108.

The overlap of the cavity 104, the first electrode 105, the first piezoelectric layer 107, and the second electrode 101 defines an active region 109 of the FBAR 100. As described in U.S. patent application Ser. No. 13/286,051 to Burak, et al., acoustic losses at the boundaries of FBAR 100 are mitigated to improve mode confinement in the active region 109. In particular, the width of an overlap 110 of the second electrode 101 and the second piezoelectric layer 108 is selected to reduce acoustic losses resulting from scattering of acoustic energy at a termination edge 111 of the second electrode 101 and away from the active region 109. Similarly, the location of the termination edge 112 of the first electrode 105 is selected to reduce acoustic losses resulting from scattering of acoustic energy at the termination edge 112.

For simplicity of description, it is assumed that in regions adjacent to termination edges 111, 112, only the imaginary thickness extensional (TE) mode exists. In addition, it is assumed that only an evanescent IF mode is predominantly excited by the E-field, and that propagating TE modes and their affects are ignored as being insignificant. In a known FBAR device that does not include the p-layer/ip-layer structure of the present teachings, the solutions to the wave equation reveal that the field displacement Uz at the termination edges of the lower and upper electrodes is excited at a comparatively large amplitude, and the impedance discontinuity at the termination edges of the lower and upper electrodes will cause a significant scattering of energy from the excited TE modes to all other modes supported by the structure, thus yielding acoustic losses and reduced Q.

The first electrode 105 and the second electrode 101 may be one of a variety of conductive materials, such as metals suitable as electrodes in BAW applications. Generally, materials suitable for the first electrode 105 and the second electrode 101 comprise Refractory metals. Transition metals or Noble Metals. In specific embodiments, the first and second electrodes 105, 101 illustratively comprise one or more of molybdenum (Mo), aluminum (Al), tungsten (W), platinum (Pt), ruthenium (Ru), niobium (Nb), hafnium (Hf) and uranium-238 (U-238), or other low-loss metals, and are fabricated using a known method. The first piezoelectric layer 107 is fabricated in accordance with the present teachings.

FIGS. 2A-2I are cross-sectional views illustrating methods of fabricating piezoelectric layers over a substrate in accordance with representative embodiments. As described more fully below, in the presently described representative embodiments, the formation of adjacent type $C_P$ and type $C_N$ piezoelectric layers over a common substrate occurs under conditions conducive to the formation of type $C_N$ ("$C_N$ recipe") piezoelectric material described in the parent application to Larson, et al., with the selective use of materials and processing parameters to foster the selective growth of a type C piezoelectric layer. The structures formed according to the methods of the representative embodiments can be selectively implemented in one or more of a variety of BAW devices comprising piezoelectric layers having opposite polarity (p-layer/ip layer) formed over the same substrate and adjacent to one another.

Many aspects of the resultant devices are common to the FBAR, 100 described in FIG. 1 and to the BAW resonator devices described in the parent application to Burak, et al., and transformers (e.g., FACT transformers), as well as other known structures and structures within the purview of one of ordinary skill in the art, having had the benefit of review of this application. Known materials and structures, as well as certain known aspects of processing used in forming such devices are generally not repeated in order to avoid obscuring the description of the methods of the representative embodiments.

Figure 2A:
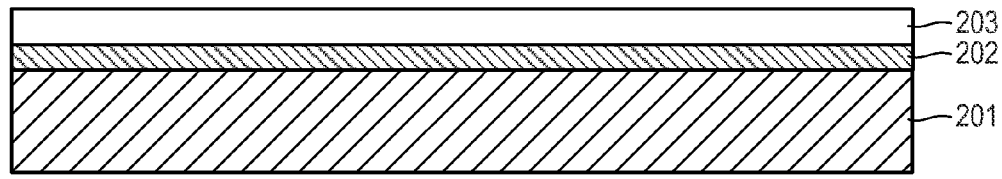
FIGS. 2A-2I are cross-sectional views illustrating methods of fabricating piezoelectric layers over a substrate in accordance with representative embodiments.

Turning first to FIG. 2A, a substrate 201 is provided and a barrier layer 202 is provided over the substrate 201. Illustratively, the substrate 201 is single-crystal silicon (Si) or other material selected for its suitability as a substrate of a bulk acoustic wave (BAW) device formed thereover. The barrier layer 202 is, for example, borosilicate glass (BSG) or silicon carbide (SiC) formed by known techniques. A first electrode layer 203 is formed over the barrier layer 202.

The barrier layer 202 is necessary due to the use of hydrogen plasma and the heating of the substrate 201 during the formation of type-$C_N$ material described below, and in the parent application of Larson, et al. The barrier layer 202 is useful in preventing the formation of silicides, which can result in undesirable flaking and can dissolve upon exposure to hydrofluoric (HF) acid used in subsequent processing. Generally, the barrier layer 202 has a thickness of less than 1000 Å, and more specifically has a thickness of approximately 200 Å to approximately 1000 Å.

Figure 2B:

Turning to FIG. 2B, an electronegative layer 204 is provided over the first electrode layer 203 in order to foster growth of type $C_P$ piezoelectric material in a selected location(s). In a representative embodiment, the first electrode layer 203 is molybdenum (Mo), and the electronegative layer 204 comprises molybdenum oxide ("moly oxide") having a thickness of approximately 100 Å. More generally, the electronegative layer 204 comprises a native oxide of the metal selected for the first electrode layer 203. Alternatively, the electronegative layer can be made of dielectric materials such as $SiO_2$, SiN, or $Al_2O_3$. Still alternatively, residual gases in the piezoelectric deposition chamber ($N_2$ or $O_2$) could provide a sufficient dielectric layer over the first electrode layer 203 to promote growth of type-$C_P$ piezoelectric material.

Generally, the thickness of the electronegative layer 204 is selected to ensure a suitable thickness for growth of type $C_P$ piezoelectric material after removal of some of the electronegative layer moly oxide) during preparation of the first electrode layer 203 for growth of type $C_N$ piezoelectric material in a subsequent step described below.

Figure 2C:
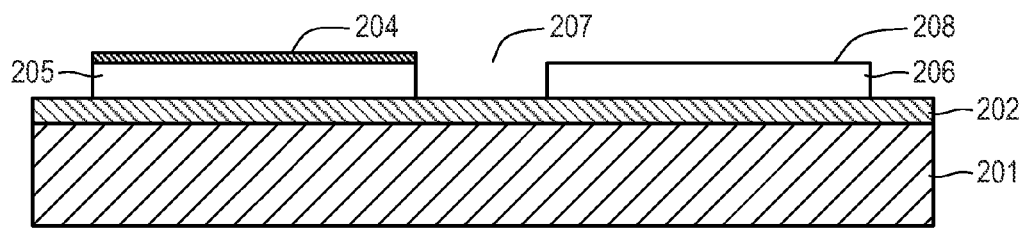

As depicted in FIG. 2C, the electronegative layer 204 is patterned, and the first electrode layer 203 is patterned to form a first lower electrode 205 and a second lower electrode 206 next to one another, but separated by a gap 207. Also, it is noted that the electronegative layer 204 is selectively removed to provide a portion 208 of the second lower electrode 206 that is unprotected during subsequent processing. The electronegative layer 204 acts as a seed layer for growth of type $C_P$ piezoelectric material thereover, under conditions designed to foster growth of type $C_N$ piezoelectric material.

Figure 2D:
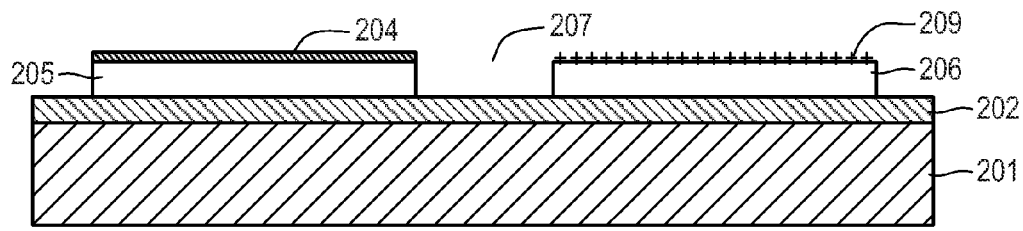

Turning to FIG. 2D, the resultant structure of FIG. 2C is provided in the piezoelectric deposition chamber, where hydrogen is flowed and hydrogen plasma is formed to activate the portion 208 for growth of type $C_N$ piezoelectric material according to the representative methods described in the parent application to Larson, et al. Notably, the flow of hydrogen plasma functions as a cleaning sequence to remove oxides and other contaminants that can form over portion 208, and results in an electropositive surface 209 at the portion 208. In a representative embodiment, the electropositive surface 209 is a substantially bare molybdenum surface and provides an active growth area for forming type $C_N$ AlN piezoelectric material over the portion 208.

To foster initial growth of type $C_N$ piezoelectric material over the portion 208, the flow of hydrogen is initially comparatively high. Illustratively, the flow rate of hydrogen is approximately 16 sccm to approximately 18 sccm After initial growth of type $C_N$ piezoelectric material over the portion 208 the flow rate of hydrogen can be reduced to a level at which $C_N$ piezoelectric material will continue to grow over the portion 208, while allowing the growth of type $C_P$ piezoelectric material over the electronegative layer 204 that remains over the first lower electrode 205. Illustratively, the flow rate of hydrogen is reduced to approximately 6 sccm to approximately 8 sccm. The continued flow of hydrogen at the reduced level substantially prevents formation of deleterious silicides, oxides and other contaminants, while allowing growth of type $C_P$ piezoelectric material over the electronegative layer 204 during growth conditions that foster growth of type $C_N$ piezoelectric material.

Figure 2E:
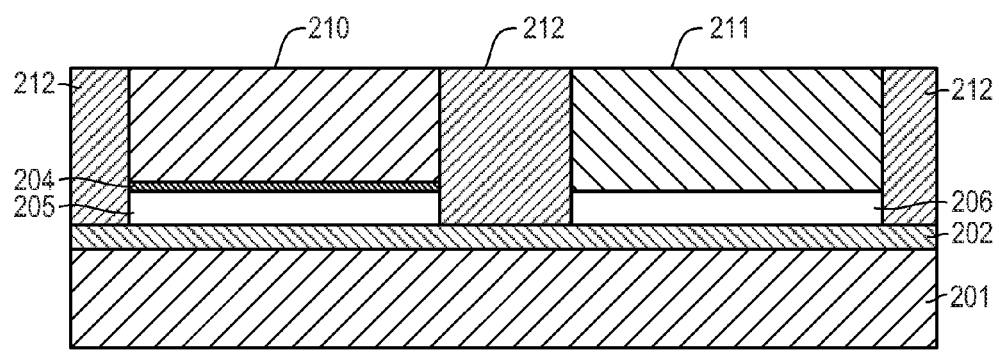

FIG. 2E depicts the resultant structure having a type $C_P$ piezoelectric layer 210 formed over the electronegative layer 204 and the first lower electrode 205, and a type $C_N$ piezoelectric layer 211 formed over the second tower electrode 206. Beneficially, the type $C_P$ piezoelectric layer 210 is a highly textured C-axis piezoelectric material. Accordingly, the C-axis orientations of the crystals of the type $C_P$ piezoelectric material are well-collimated, and as such are parallel with one another (i.e., oriented in the y-direction of the coordinate system depicted in FIG. 2E) and perpendicular to the plane (i.e., the x-z plane of the coordinate system depicted in FIG. 2E) of first lower electrode 205 over which the type $C_P$ piezoelectric layer 210 is formed. Similarly, the type $C_N$ piezoelectric layer 211 is a highly textured C-axis piezoelectric material. Accordingly, the C-axis orientations of the crystals of the type $C_N$ piezoelectric material are well-collimated, and as such are parallel with one another (i.e., oriented in the negative y-direction of the coordinate system depicted in FIG. 2E) and perpendicular to the plane (i.e., the x-z plane of the coordinate system depicted in FIG. 2E) of second lower electrode 206 over which type $C_P$ piezoelectric layer 210 is formed.

The type $C_P$ piezoelectric layer 210 and the type $C_N$ piezoelectric layer 211 are formed substantially simultaneously in the same chamber and under conditions conducive to the formation of type $C_P$ material. As noted above, the flow rate of hydrogen is comparatively high during the formation of an initial thickness (e.g., 1000 Å) of type $C_N$ piezoelectric material, and after the formation of the initial thickness of type $C_N$ piezoelectric material at a comparatively reduced flow rate of hydrogen. Again, many of the details of the growth of the type $C_P$ piezoelectric layer 210 and the type $C_N$ piezoelectric layer 211 are described in the parent application to Larson, et al, with modifications of materials and processing parameters described herein to foster selective growth of type $C_N$ piezoelectric material and type $C_P$ piezoelectric material adjacent to one another.

During formation of the type $C_P$ piezoelectric layer 210 and the type $C_N$ piezoelectric layer 211, a layer 212 of material (e.g., AlN) is formed over the unprepared barrier layer 202 in the gap 207 between the type $C_P$ piezoelectric layer 210 and the type $C_N$ piezoelectric layer 211. By contrast to type $C_P$ piezoelectric layer 210 and type $C_N$ piezoelectric layer 211, layer 212 is generally a polycrystalline material that exhibits little or no piezoelectric effects because many facets initiate crystal growth in a variety of directions. As such, layer 212 generally does not exhibit piezoelectric properties, and can be removed.

Figure 2F:
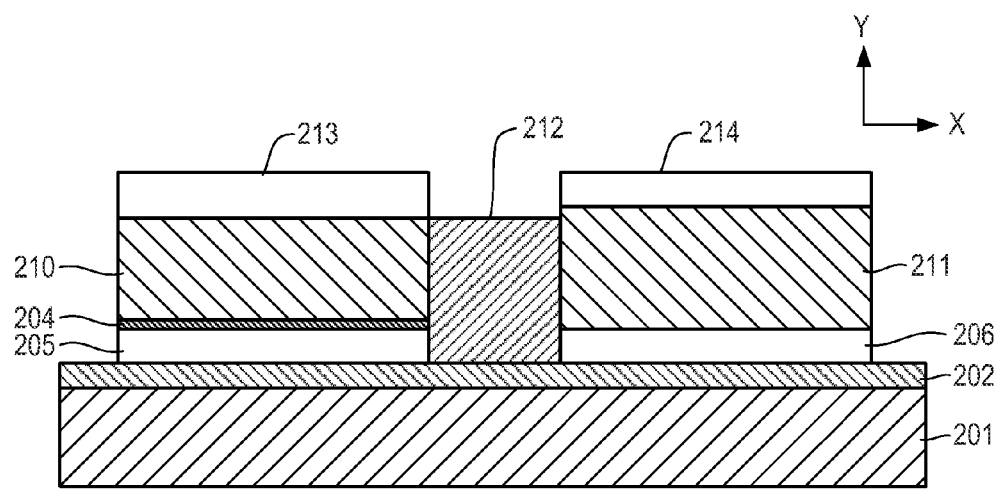

FIG. 2F depicts the resultant structure after the formation of first upper electrode 213 and second upper electrode 214 over the type $C_P$ piezoelectric layer 210 and the type $C_N$ piezoelectric layer 211, respectively.

As will be appreciated by one of ordinary skill in the art, the resultant structure depicted in FIG. 2F provides the type C piezoelectric layer 210 and the type $C_N$ piezoelectric layer 211 adjacent to one another and over the same substrate, which can be the basis of a variety of devices. For example, by bussing the first and second lower electrodes 205, 206 together, and bussing the first and second upper electrodes 213, 214 and selectively connecting the first and second lower electrodes 205, 206 to a source of electrical power, a transformer (e.g. a FACT transformer) can be provided.

Figure 2G:
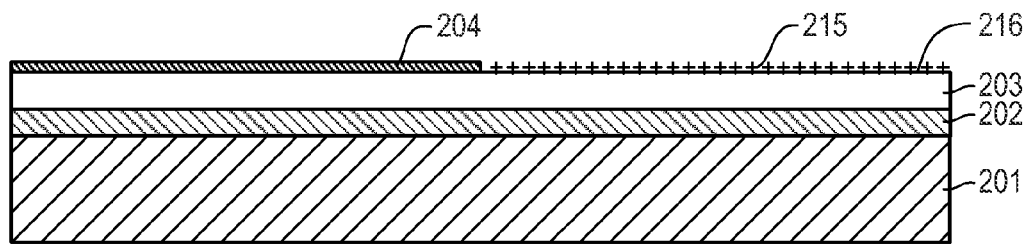

In other embodiments, the type $C_P$ piezoelectric layer 210 and the type $C_N$ piezoelectric layer 211 can be fabricated immediately next to one another and in contact with one another (i.e., without gap 207 and layer 212 between the type $C_P$ piezoelectric and type $C_N$ piezoelectric layers 210, 211). This structure can be fabricated through a slight variation in the processing sequence depicted in FIGS. 2A-2F of the representative embodiments described in connection therewith. Notably, after the formation of the electronegative layer 204 at FIG. 2B, the method continues as depicted in FIG. 2G, in which the first electrode layer 203 is not patterned as described in connection with the processing sequence of FIG. 2C, but rather remains a single layer. Rather, the electronegative layer 204 is patterned and removed from one side of the first electrode layer 203 to reveal portion 215.

The structure depicted in FIG. 2G is provided in the piezoelectric deposition chamber, and hydrogen is flowed and hydrogen plasma is formed to activate the portion 215 for growth of type $C_N$ piezoelectric material according to the representative methods described in the parent application to Larson, et al. As described above, the flow of hydrogen plasma functions as a cleaning sequence to remove oxides and other contaminants that can form over portion 215, and results in the formation of an electropositive surface 216 at the portion 215. In a representative embodiment, the electropositive surface 216 is a substantially bare molybdenum surface and provides as an active growth area for forming type $C_N$ AlN piezoelectric material over the portion 215.

To foster initial growth of type $C_N$ piezoelectric material over the portion 215, the flow of hydrogen is initially comparatively high (e.g., on the order of approximately 16 sccm to approximately 18 sccm). After initial growth of type $C_N$ piezoelectric material over the portion 215 the flow rate of hydrogen is reduced to a level at which $C_N$ piezoelectric material will continue to grow over the portion 215 (e.g., approximately 6 sccm to 8 sccm), white allowing the growth of type $C_P$ piezoelectric material over the electronegative layer 204 that remains over the first electrode layer 203. As noted above, the continued flow of hydrogen at the reduced level substantially prevents formation of deleterious silicides, while allowing growth of type $C_P$ piezoelectric material over the electronegative layer 204 during growth conditions that primarily foster growth of type $C_N$ piezoelectric material.

Figure 2H:
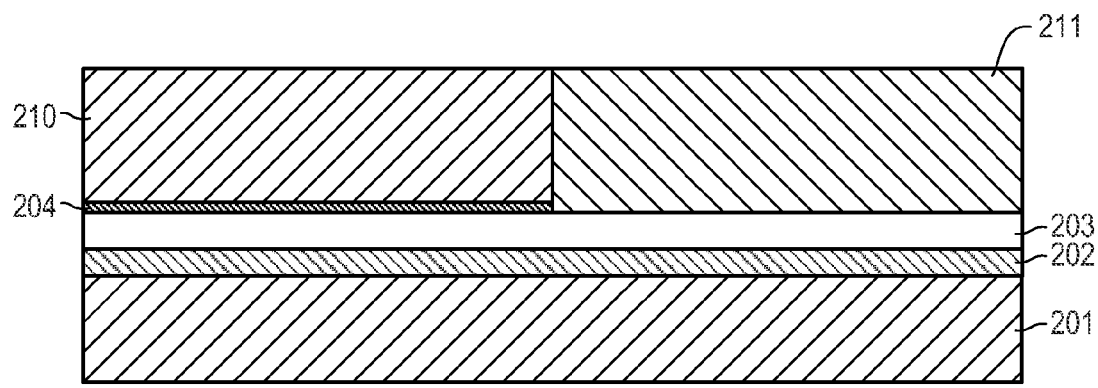

FIG. 2H depicts the resultant structure having type $C_P$ piezoelectric layer 210 formed over the electronegative layer 204 and type $C_N$ piezoelectric layer 211 formed over the first electrode layer 203. The type $C_P$ piezoelectric layer 210 and the type $C_N$ piezoelectric layer 211 are formed substantially simultaneously in the same chamber and under the same growth conditions, with an initially comparatively high flow rate of hydrogen and, after the initial formation of an initial thickness (e.g., less that 1000 Å) of the type $C_N$ piezoelectric material, at a comparatively reduced flow rate of hydrogen. Again, many of the details of the growth of the type $C_P$ piezoelectric layer 210 and the type $C_N$ piezoelectric layer 211 are described in the parent application to Larson, et al, with modifications of materials and processing parameters described herein to foster selective growth of highly-textured type $C_N$ piezoelectric material and highly textured type $C_P$ piezoelectric material adjacent to one another.

As depicted in FIG. 2H, the type $C_P$ piezoelectric layer 210 and the type $C_N$ piezoelectric layer 211 are immediately next to one another and are in contact with one another. Next, as depicted in FIG. 2I, a second electrode 217 is formed over the type $C_P$ piezoelectric layer 210 and the type $C_N$ piezoelectric layer 211.

Figure 2I:
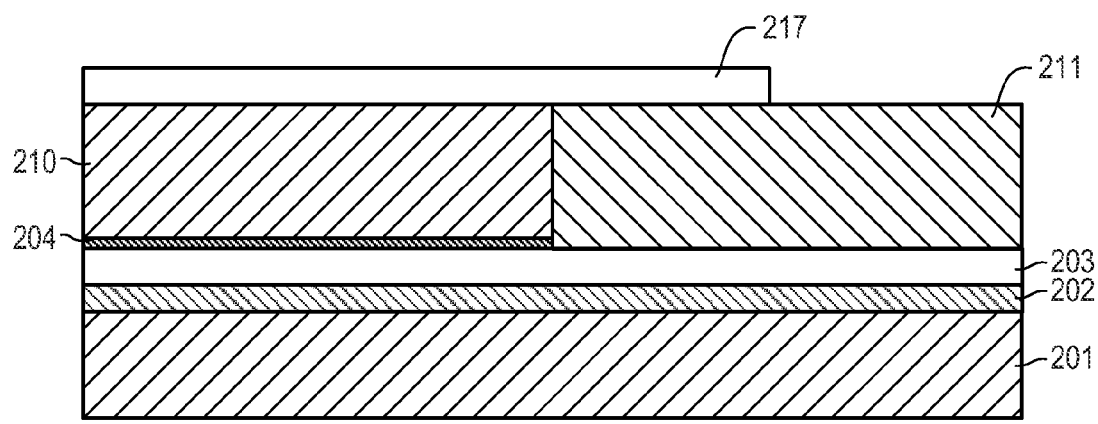

The structure depicted in FIG. 2I may be referred to as a "p/ip" structure such as in the parent application to Burak, et al. The p/ip structure lends itself to improvements in performance in FBAR devices, SBAR devices and CRF devices, as is described in the parent application to Burak, et al. Notably, the process sequence to form the type $C_P$ piezoelectric layer 210 and the type $C_N$ piezoelectric layer 211 immediately next to one another and in contact can be repeated to realize p/ip interfaces at other locations and levels of the selected acoustic stack for the desired BAW device.

Finally, it is noted that certain known components of BAW resonator structures (e.g., acoustic reflectors, frame elements and other structures) are contemplated for inclusion in the BAW resonator devices fabricated according to the methods of the representative embodiments. These structures are fabricated according to known methods, and their fabrication is integrated into the overall process flow for fabricating the desired BAW resonator device including the methods of the representative embodiments.

FIGS. 3A-3J are cross-sectional views illustrating methods of fabricating piezoelectric layers over a substrate in accordance with representative embodiments.

As described more fully below, in the presently described representative embodiments, the formation of adjacent type $C_p$ and type $C_N$ piezoelectric layers over a common substrate occurs under conditions conducive to the formation of type $C_p$ ("$C_p$ recipe") piezoelectric material described in the parent application to Larson, et al., with the selective use of materials and processing parameters to foster the selective growth of type $C_N$ piezoelectric layers. The structures formed according to the methods of the representative embodiments can be selectively implemented in one or more of a variety of BAW devices comprising piezoelectric layers having opposite polarity (p-layer/ip layer) formed over the same substrate and adjacent to one another. Many aspects of the resultant devices are common to the FBAR 100 described in FIG. 1 and to the BAW resonator devices described in the parent application to Burak, et al., and transformers (e.g., FACT transformers), as well as other known structures and structures that are within the purview of one of ordinary skill in the art, having had the benefit of review of this application. Known materials and structures as well as certain known aspects of processing used in forming such devices are generally not repeated in order to avoid obscuring the description of the methods of the representative embodiments.

Figure 3A:
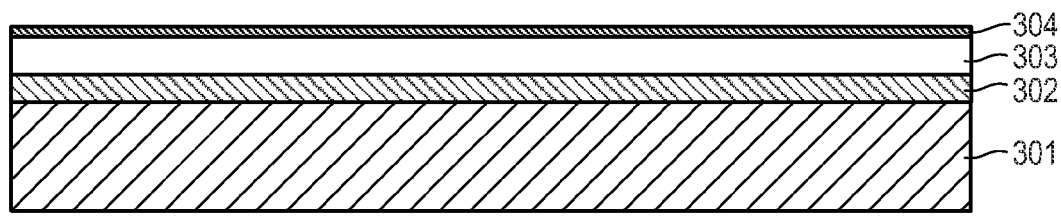

Turning first to FIG. 3A, a substrate 301 is provided and a barrier layer 302 is provided over the substrate. Illustratively, the substrate 301 is single-crystal silicon (Si) or other material selected for its suitability as a substrate of a bulk acoustic wave (BAW) device formed thereover. A first electrode layer 303 is formed over the barrier layer 302. The barrier layer 302 is, for example, borosilicate glass (BSG) or silicon carbide (SiC) formed by known techniques. The barrier layer 302 is necessary due to the use of hydrogen plasma and heating of the substrate 301 during the formation of type-$C_N$ material described below, and in the parent application of Larson, et al. The barrier layer 302 is useful in preventing the formation of silicides, which can result in flaking and dissolve upon exposure to hydrofluoric (HF) acid used in subsequent processing.

Figure 3B:
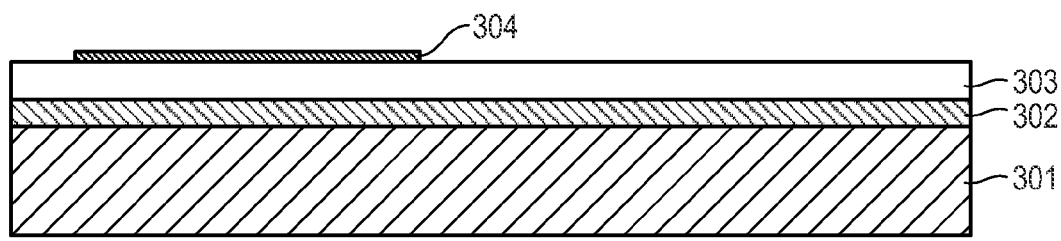

Turning to FIG. 3B, an electronegative layer 304 is provided over the first electrode layer 303 in order to foster growth of type $C_p$ piezoelectric material in a selected location(s). In a representative embodiment, the first electrode layer 303 is molybdenum (Mo), and the barrier layer comprises molybdenum oxide ("moly oxide") having a thickness of approximately 100 Å. More generally, the electronegative layer 304 comprises a native oxide of the metal selected for the first electrode layer 303. Alternatively, the electronegative layer 204 can be made of dielectric materials such as $SiO_2$, SiN, or $Al_2O_3$. Still alternatively, residual gases in the piezoelectric deposition chamber ($N_2$ or $O_2$) could provide a sufficient dielectric layer over the first electrode layer 303 to promote growth of type-$C_P$ piezoelectric material.

The thickness of the electronegative layer 304 is selected to ensure a suitable thickness for growth of type $C_p$ piezoelectric material after removal of some of the electronegative layer 304 (e.g., moly oxide) during preparation of the first electrode layer 303 for growth of type $C_N$ piezoelectric material in a subsequent step described below.

Figure 3C:
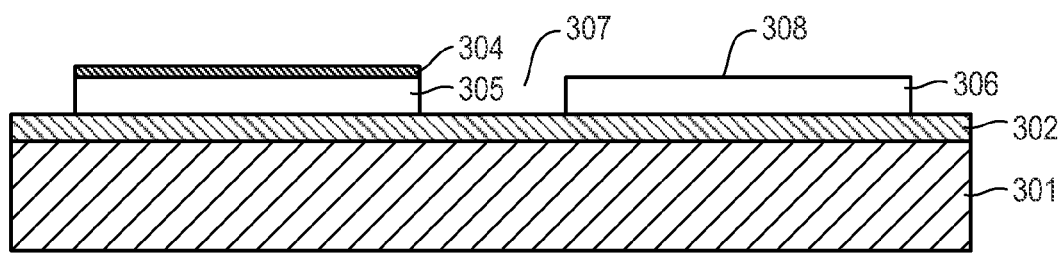

As depicted in FIG. 3C, the electronegative layer 304 is patterned, and the first electrode layer 303 is patterned to form a first lower electrode 305 and a second lower electrode 306 next to one another, but separated by a gap 307. Also, it is noted that the electronegative layer 304 is selectively removed to provide a portion 308 of the second lower electrode 306 that is unprotected during subsequent processing. As described more fully below, the electronegative layer 304 acts as a seed layer for growth of type $C_P$ piezoelectric material thereover, under conditions designed to foster growth of type $C_N$ piezoelectric material.

Figure 3D:
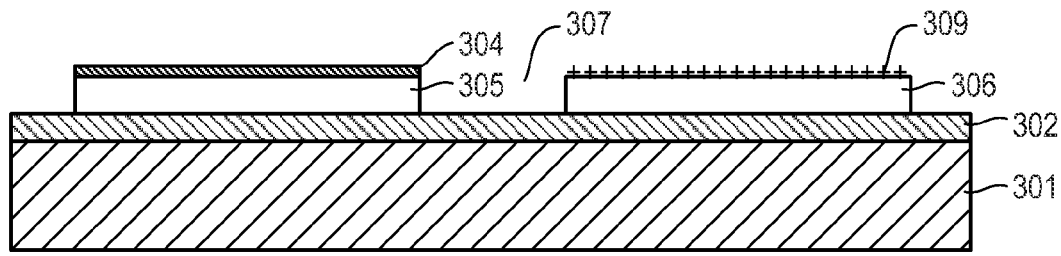

Turning to FIG. 3D, the resultant structure of FIG. 3C is provided in the piezoelectric deposition chamber, and hydrogen is flowed and hydrogen plasma formed. At this stage of the method, the flow rate of hydrogen is comparatively high. Illustratively, the flow rate of hydrogen is approximately 16 sccm to approximately 18 sccm. The flow of hydrogen plasma functions as a cleaning sequence to remove oxides and other contaminants that can form over portion 308, and results in the formation of an electropositive surface 309 at the portion 308. In a representative embodiment, the electropositive surface 309 is a substantially bare molybdenum surface and provides an active growth area for forming type $C_N$ AlN piezoelectric material over the portion 308.

Figure 3E:
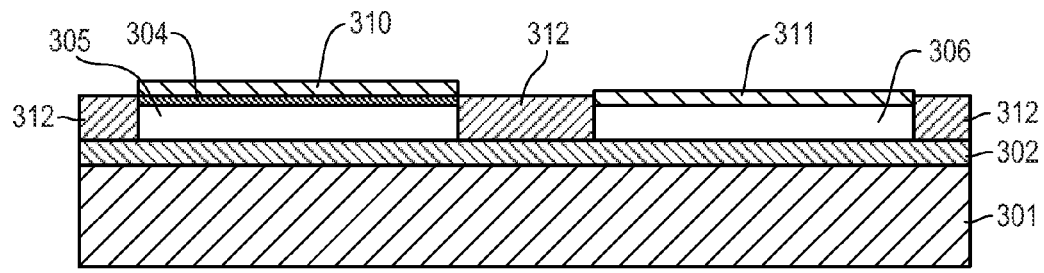
Figure 3F:
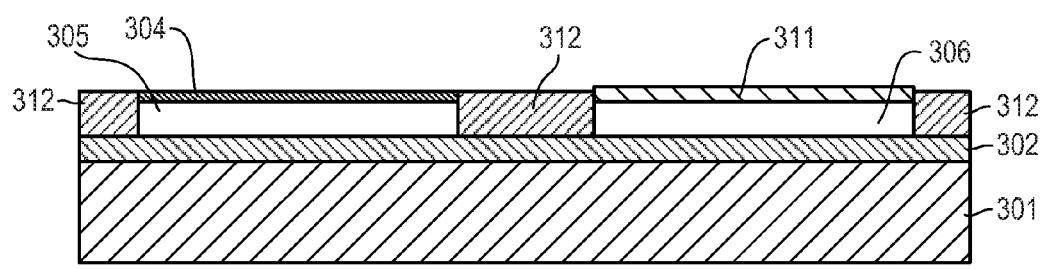

FIG. 3E depicts the resultant structure having a type $C_P$ piezoelectric layer 310 formed over the electronegative layer 304 and the first lower electrode 305, and a type $C_N$ piezoelectric seed layer 311 formed over the second lower electrode 306. In accordance with a representative embodiment, the type $C_N$ piezoelectric seed layer 311 comprises AlN and fosters growth of type-$C_N$ AlN. As described in the parent application to Larson, et al., the type $C_N$ piezoelectric seed layer 311 has a thickness in the range of approximately 50 Å to approximately 1000 Å over the surface of the second lower electrode 306.

The type $C_P$ piezoelectric layer 310 and the type $C_N$ piezoelectric seed layer 311 are formed substantially simultaneously in the same chamber under conditions conducive to the growth of type $C_N$ piezoelectric material as described in the parent application to Larson, et al. The growth of type $C_P$ piezoelectric layer 310 occurs with the hydrogen flow continued, albeit at a lower flow rate (e.g., approximately 6 sccm to 8 sccm) to ensure growth of the type $C_N$ piezoelectric seed layer 311 Illustratively, the type $C_N$ piezoelectric seed layer 311 has a thickness of approximately 500 Å. Generally, the type $C_N$ piezoelectric seed layer 311 has a thickness of approximately 50 Å to approximately 1000 Å. Layer 312 is formed in areas over the barrier layer 302 that have not been prepared to foster of growth of either type $C_N$ piezoelectric material or type $C_P$ piezoelectric material (e.g., in gap 307). By contrast to type $C_P$ piezoelectric layer 310 and type $C_N$ piezoelectric seed layer 311, layer 312 is generally a polycrystalline material that exhibits little or no piezoelectric effects because many facets initiate crystal growth in a variety of directions. As such, layer 312 generally does not exhibit piezoelectric properties, and can be removed.

The structure depicted in FIG. 3E is removed from the piezoelectric deposition chamber, and the type $C_P$ piezoelectric layer 310 initially formed aver the electronegative layer 304 is removed using known masking and etching techniques. The removal of the type $C_P$ piezoelectric layer 310 reveals the electronegative layer 304.

After the type $C_P$ piezoelectric layer 310 is removed, the structure in FIG. 3F is again provided in the piezoelectric deposition chamber. Next, hydrogen is flowed at a comparatively high rate (e.g., approximately 16 sccm to approximately 18 sccm) and hydrogen plasma is formed. The flow of hydrogen plasma functions as a cleaning sequence to remove oxides and other contaminants that can form over portion the electronegative layer 304 and the type $C_N$ piezoelectric seed layer 311 during the process of removing the type $C_P$ piezoelectric layer 310.

After the cleaning sequence is completed, the electronegative layer 304 and the type $C_N$ piezoelectric seed layer 311 are exposed, and the simultaneous growth of type $C_P$ piezoelectric material and type $C_N$ piezoelectric material adjacent to one another begins. In the presently described embodiments, the growth of type $C_P$ piezoelectric material and type $C_N$ piezoelectric material occurs under conditions favorable to the growth of type $C_P$ piezoelectric material as described in the parent application to Larson, et al. Notably, hydrogen is flowed during the growth of the type $C_P$ piezoelectric material and type $C_N$ piezoelectric material at this stage of the process. The flow rate of the hydrogen is comparatively low (e.g., the flow rate is reduced to between approximately 6 sccm and 8 sccm) to maintain growth of the type $C_N$ piezoelectric material. Because of the preparation of the type $C_N$ piezoelectric seed layer 311, type $C_N$ piezoelectric material is formed over the type $C_N$ piezoelectric seed layer 311, whereas over the electronegative layer 304, type $C_P$ piezoelectric material is formed.

Figure 3G:
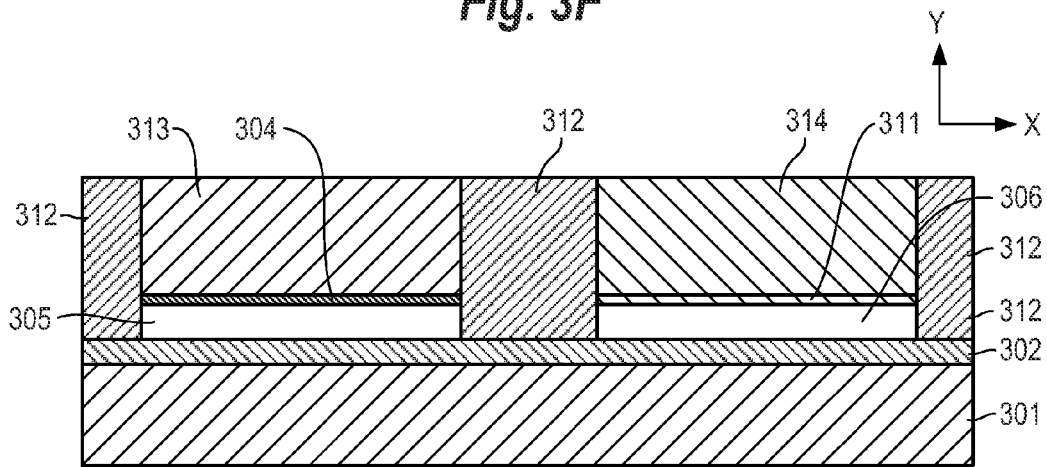

As depicted in FIG. 3G, a type-$C_P$ piezoelectric layer 313 is formed over the electronegative layer 304 and the first lower electrode 305, and a type-$C_N$ piezoelectric layer 314 is formed over the second lower electrode 306. The type-$C_P$ piezoelectric layer 313 and the type-$C_N$ piezoelectric layer 314 are formed substantially simultaneously in the same chamber and under growth conditions conducive to the growth of type $C_P$ piezoelectric material. Beneficially, the type-$C_P$ piezoelectric layer 313 is a highly textured C-axis piezoelectric material. Accordingly, the C-axis orientations of the crystals of the type $C_P$ piezoelectric material are well-collimated, and as such are parallel with one another (i.e., oriented in the y-direction of the coordinate system depicted in FIG. 3G) and perpendicular to the plane (i.e., the x-z plane of the coordinate system depicted in FIG. 3G) of first lower electrode 305 aver which the type-$C_P$ piezoelectric layer 313 is formed. Similarly, the type-$C_N$ piezoelectric layer 314 is a highly textured C-axis piezoelectric material. Accordingly, the C-axis orientations of the crystals of the type $C_N$ piezoelectric material are well-collimated, and as such are parallel with one another i.e., oriented in the –y-direction of the coordinate system depicted in FIG. 3G) and perpendicular to the plane (i.e., the x-z plane of the coordinate system depicted in FIG. 3G) of second tower electrode 306 over which type-$C_P$ piezoelectric layer 313 is formed.

In a manner substantially identical to that described above in connection with FIG. 2F, first and second upper electrodes (not shown) can be formed over the type-$C_P$ piezoelectric layer 313 and the type-$C_N$ piezoelectric layer 314, respectively. These electrodes can then be connected to an electrical power source to provide a variety of BAW resonator devices (e.g.; FACT transformers).

The type-$C_P$ piezoelectric layer 313 and the type-$C_N$ piezoelectric layer 314 can be provided immediately next to one another and in contact with one another (i.e., without gap 307 and layer 312 between the type-$C_P$ piezoelectric and type-$C_N$ piezoelectric layers 313, 314). This structure can be fabricated through a slight variation in the processing sequence depicted in FIGS. 3A-3F of the representative embodiments described in connection therewith. Notably, after the formation of the electronegative layer 304 at FIG. 3B, the first electrode layer 303 is not patterned as described in connection with the processing sequence of FIG. 3C, but rather remains as a single layer. Instead, the electronegative layer 304 is patterned and removed from one side of the first electrode layer 303.

The structure depicted in FIG. 3B is provided in the piezoelectric deposition chamber, and hydrogen is flowed and hydrogen plasma formed. At this stage of the method, the flow rate of hydrogen is comparatively high. Illustratively, the flow rate of hydrogen is approximately 16 sccm to approximately 18 sccm. The flow of hydrogen plasma functions as a cleaning sequence to remove oxides and other contaminants that can form on the first electrode layer 303, and results in an electropositive surface (not shown) at the exposed portion of the first electrode layer 303. As described above, in a representative embodiment the electropositive surface is a substantially bare molybdenum surface and provides an active growth area for forming type $C_N$ piezoelectric seed layer directly on the first electrode layer.

The type $C_P$ piezoelectric layer 310 and the type $C_N$ piezoelectric seed layer 311 are formed substantially simultaneously in the same chamber under conditions conducive to the growth of type $C_N$ piezoelectric material as described in the parent application to Larson, et al. The growth of the piezoelectric layer (e.g., AlN) occurs with the hydrogen flow continued, albeit at a lower flow rate (e.g., approximately 6 sccm to 8 sccm) to ensure growth of the type $C_N$ piezoelectric seed layer 311. Illustratively, the type $C_N$ piezoelectric seed layer 311 has a thickness of approximately 500 Å. Generally, the type $C_N$ piezoelectric seed layer 311 has a thickness of approximately 50 Å to approximately 1000 Å. Layer 312 is formed in areas over the barrier layer 302 that have not been prepared to foster of growth of either type $C_N$ piezoelectric material or type $C_P$ piezoelectric material (e.g., in gap 307).

Figure 3H:
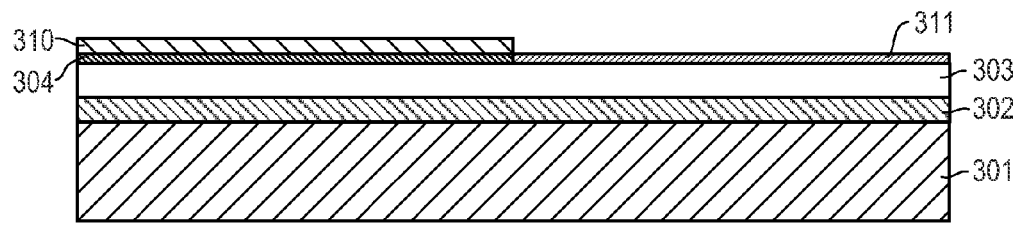

FIG. 3H depicts the resultant structure having type $C_P$ piezoelectric layer 310 formed over the electronegative layer 304 and the type $C_N$ piezoelectric seed layer 311 formed over the first electrode layer 303.

The structure depicted in FIG. 3H is removed from the piezoelectric deposition chamber, and the type $C_P$ piezoelectric layer 310 initially formed over the electronegative layer 304 is removed using known masking and etching techniques. The removal of the type $C_P$ piezoelectric layer 310 reveals the electronegative layer 304. The resultant structure is depicted in FIG. 3I.

Figure 3I:
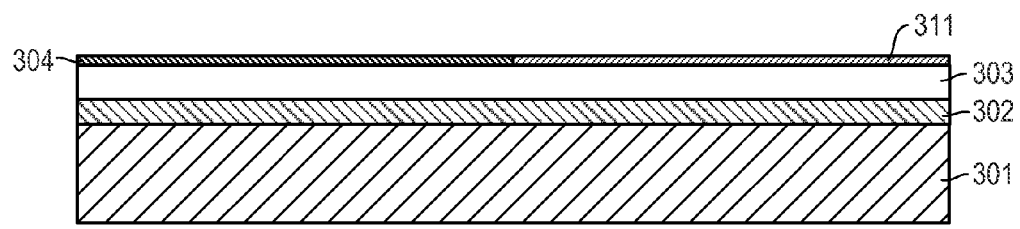

The structure depicted in FIG. 3I is returned to the piezoelectric deposition chamber and hydrogen is flowed and hydrogen plasma formed. At this stage of the method, the flow rate of hydrogen is again comparatively high. Illustratively, the flow rate of hydrogen is approximately 16 sccm to approximately 18 sccm. The flow of hydrogen plasma functions as a cleaning sequence to remove oxides and other contaminants that can form on the first electrode layer 303 and on the type $C_N$ piezoelectric seed layer 311 during the removal of the type $C_P$ piezoelectric layer 310.

After the cleaning step is completed, the simultaneous growth of type $C_P$ piezoelectric material and type $C_N$ piezoelectric material adjacent to one another is carried out. In the presently described embodiments, the growth of highly textured type $C_P$ piezoelectric material and highly textured type $C_N$ piezoelectric material occurs under conditions favorable to the growth of type $C_P$ piezoelectric material as described in the parent application to Larson, et al. Notably, hydrogen is flowed during the growth of the type $C_P$ piezoelectric material and type $C_N$ piezoelectric material at this stage of the process. The flow rate of the hydrogen is comparatively low to maintain growth of the type $C_N$ piezoelectric material. For example, the flow rate is reduced to between approximately 6 sccm and 8 sccm. Because of the preparation of the type $C_N$ piezoelectric seed layer 311, type $C_N$ piezoelectric material is formed over the type $C_N$ piezoelectric seed layer 311 whereas over the electronegative layer 304, type $C_P$ piezoelectric material is formed.

Figure 3J:
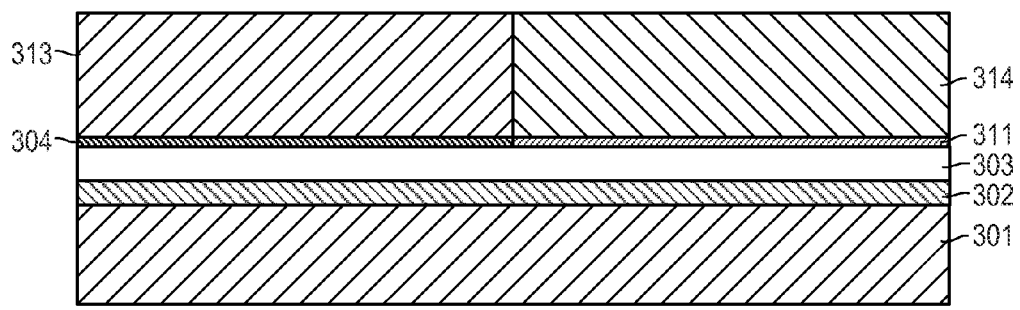

As depicted in FIG. 3J, a type-$C_P$ piezoelectric layer 313 is formed over the electronegative layer 304, and a type-$C_N$ piezoelectric layer 314 is formed over the first electrode layer 303. The type-$C_P$ piezoelectric layer 313 and the type-$C_N$ piezoelectric layer 314 are disposed immediately next to and on contact with each other, and are formed substantially simultaneously in the same chamber and under the same growth conditions.

In a manner substantially identical to that described above in connection with FIG. 2I, an upper electrode (not shown) can be formed over the type-$C_P$ piezoelectric layer 313 and the type-$C_N$ piezoelectric layer 314, respectively. Again, the resultant structure may be referred to as a "p/ip" structure such as described in the parent application to Burak, et al. The p/ip structure lends itself to improvements in performance in FBAR, devices, SBAR devices and CRF devices, as is described in the parent application to Burak, et al. Notably, the process sequence to form the type $C_P$ piezoelectric layer 310 and the type $C_N$ piezoelectric seed layer 311 immediately next to one another and in contact can be repeated to realize p/ip interfaces at other locations and levels of the selected acoustic stack for the desired BAW device.

It is again noted that certain known components of BAW resonator structures (e.g., acoustic reflectors, frame elements and other structures) are contemplated for inclusion in the BAW resonator devices fabricated according to the methods of the representative embodiments. These structures are fabricated according to known methods, and their fabrication is integrated into the overall process flow for fabricating the desired BAW resonator device including the methods of the representative embodiments.

FIGS. 4A-4H are cross-sectional views illustrating methods of fabricating piezoelectric layers over a substrate in accordance with representative embodiments.

As described more fully below, in the presently described representative embodiments, the formation of adjacent type $C_P$ and type $C_N$ piezoelectric layers over a common substrate occurs in conditions conducive to the formation of type $C_p$ ("$C_p$ recipe") described in the parent application to Larson, et al., with the selective use of a type $C_N$ piezoelectric seed layer and processing parameters selected to foster growth of both type $C_N$ piezoelectric material and type $C_N$ piezoelectric material.

The structures formed according to the methods of the representative embodiments can be selectively implemented in one or more of a variety of BAW devices comprising piezoelectric layers having opposite polarity (p-layer/ip layer) formed over the same substrate and adjacent to one another. Many aspects of the resultant devices are common to the FBAR 100 described in FIG. 1 and to the BAW resonator devices described in the parent application to Burak, et al., and transformers (e.g., FACT transformers), as well as other known structures and structures that are within the purview of one of ordinary skill in the art, having had the benefit of review of this application. Known materials and structures, as well as certain known aspects of processing used in forming such devices are generally not repeated in order to avoid obscuring the description of the methods of the representative embodiments.

Figure 4A:
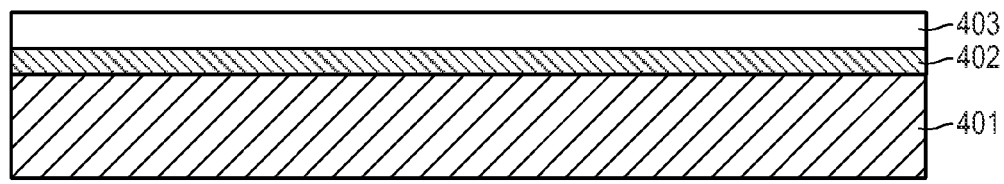
FIGS. 4A-4H are cross-sectional views illustrating methods of fabricating piezoelectric layers over a substrate in accordance with representative embodiments.

Turning first to FIG. 4A, a substrate 401 is provided and a barrier layer 402 is provided over the substrate. Illustratively, the substrate 401 is single-crystal silicon (Si) or other material selected for its suitability as a substrate of a bulk acoustic wave (RAW) device formed thereover. The barrier layer 402 is, for example, borosilicate glass (BSG) or silicon carbide (SiC) formed by known techniques. The barrier layer 402 is necessary due to the use of hydrogen plasma and heating of the substrate 401 during the formation of type-$C_N$ material described below, and in the parent application of Larson, et al. The barrier layer 402 is useful in preventing the formation of silicides, which can result in flaking and dissolve upon exposure to hydrofluoric (HF) acid used in subsequent processing. A first electrode layer 403 is formed over the barrier layer.

Figure 4B:
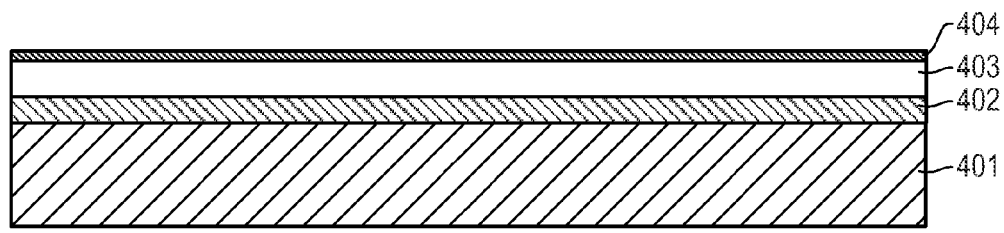

Turning to FIG. 4B, a type $C_N$ piezoelectric seed layer 404 is provided over the first electrode layer 403 in order to foster growth of type $C_N$ piezoelectric material in a selected location(s). In accordance with a representative embodiment, the type $C_N$ piezoelectric seed layer 404 is aluminum (Al) and fosters growth of piezoelectric layer of type-$C_N$ AlN. It is noted that the selection of Al as the type $C_N$ piezoelectric seed layer 404 is merely illustrative. Alternatively, the type $C_N$ piezoelectric seed layer 404 may be molybdenum (Mo), tungsten platinum (Pt), ruthenium (Ru), niobium (Nb), hafnium (Hf) or uranium-238 (U-238). As described above and in the parent application to Larson, et al., the type $C_N$ piezoelectric seed layer 404 has a thickness in the range of approximately 50 Å to approximately 1000 Å over the surface of the first electrode layer 403.

Figure 4C:
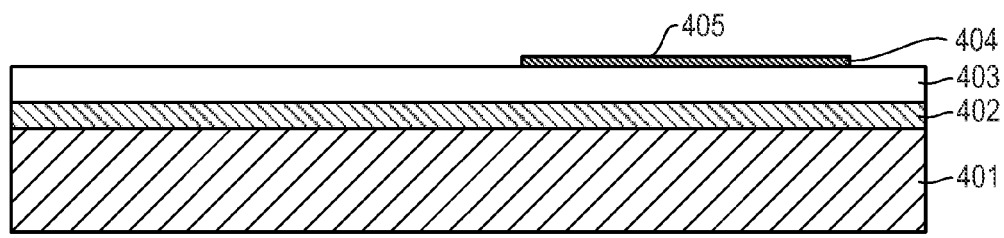

As depicted in FIG. 4C, the type $C_N$ piezoelectric seed layer 404 is patterned to form a portion 405 over the first electrode layer 403.

Figure 4D:
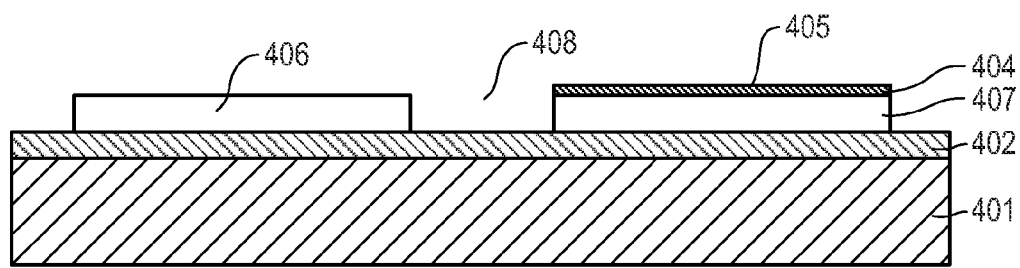

As depicted in FIG. 4D, the first electrode layer 403 is patterned to form a first lower electrode 406 and a second lower electrode 407 next to one another, but separated by a gap 408.

Figure 4E:
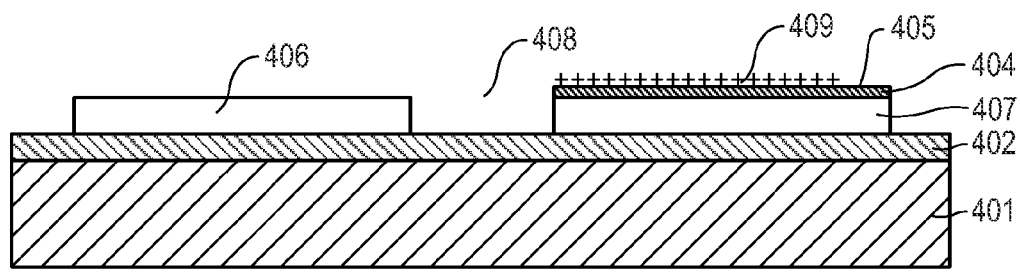

As depicted in FIG. 4E, the resultant structure of FIG. 4D is provided in the piezoelectric deposition chamber, and hydrogen is flowed at a comparatively high rate (e.g., approximately 16 sccm to approximately 18 sccm) and hydrogen plasma is formed. The flow of hydrogen plasma functions as a cleaning sequence to remove oxides and other contaminants that can form over portion 405 of the type $C_N$ piezoelectric seed layer 404 and over the first lower electrode 406 during the process of patterning the type $C_N$ piezoelectric seed layer 404 and first lower electrode 406. After the cleaning sequence is completed, the flow rate of hydrogen is reduced, and hydrogen plasma activates the portion 405 of the type $C_N$ piezoelectric seed layer 404 creating an electropositive surface 409 for growth of type $C_N$ piezoelectric material according to the representative methods described in the parent application to Larson, et al.

Figure 4F:
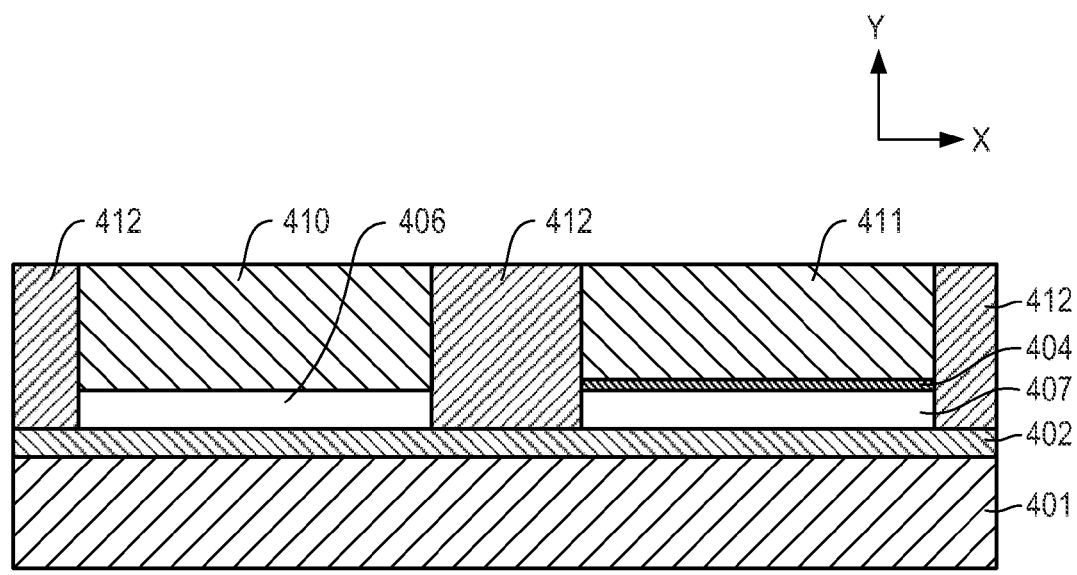

The structure depicted in FIG. 4E remains in the piezoelectric deposition chamber after the cleaning sequence with no vacuum break. As depicted in FIG. 4F, the method continues under conditions conducive to the formation of type $C_P$ ("$C_P$ recipe") described in the parent application to Larson, et al. Notably a type $C_P$ piezoelectric layer 410 is formed over the first lower electrode 406 and a type $C_N$ piezoelectric layer 411 is formed over the portion 405. In a representative embodiment, the growth of type $C_N$ MN occurs over the type $C_N$ piezoelectric seed layer 404 at portion 405, and the growth of type $C_p$ AlN occurs over the first lower electrode 406. A layer 412 of material (e.g., AlN) is formed over the unprepared barrier layer 402 during the growth sequence of the type $C_P$ piezoelectric layer 410 and the type $C_N$ piezoelectric layer 411. In contrast to type $C_P$ piezoelectric layer 410 and type $C_N$ piezoelectric layer 411, layer 412 is generally a polycrystalline material that exhibits little or no piezoelectric effects because many facets initiate crystal growth in a variety of directions. As such, layer 412 generally does not exhibit piezoelectric properties, and can be removed.

The process continues under conditions conducive to the growth of type $C_p$ piezoelectric material as described in parent application to Larson, et al. The growth of the piezoelectric material (e.g., AlN) occurs with the hydrogen flow continued, albeit at a lower flow rate (e.g., approximately 6 sccm to approximately 8 sccm to ensure growth of the type $C_N$ piezoelectric layer 411.

Beneficially, the type $C_P$ piezoelectric layer 410 is a highly textured C-axis piezoelectric material. Accordingly, the C-axis orientations of the crystals of the type $C_P$ piezoelectric material are well-collimated, and as such are parallel with one another (i.e., oriented in the y-direction of the coordinate system depicted in FIG. 4F) and perpendicular to the plane (i.e., the x-z plane of the coordinate system depicted in FIG. 4F) of first tower electrode 406 over which the type $C_P$ piezoelectric layer 410 is formed. Similarly, the type $C_N$ piezoelectric layer 411 is a highly textured C-axis piezoelectric material. Accordingly, the C-axis orientations of the crystals of the type $C_N$ piezoelectric material are well-collimated, and as such are parallel with one another (i.e., oriented in the −y-direction of the coordinate system depicted in FIG. 4F) and perpendicular to the plane i.e., the x-z plane of the coordinate system depicted in FIG. 4F) of second tower electrode 306 over which type $C_P$ piezoelectric layer 410 is formed.

After formation of the type $C_P$ piezoelectric layer 410 over the first lower electrode 406, and a type $C_N$ piezoelectric layer 411 over the second lower electrode 407, first and second upper electrodes (not shown) can be formed over the type $C_P$ piezoelectric layer 410 and the type $C_N$ piezoelectric layer 411, respectively. These electrodes can then be connected to an electrical power source to provide a variety of BAW resonator devices (e.g., FACT transformers).

The type $C_P$ piezoelectric layer 410 and the type $C_N$ piezoelectric layer 411 can be provided immediately next to one another and in contact with one another (i.e., without gap 408 and layer 412 between the type $C_P$ and type $C_N$ piezoelectric layers 410, 411). This structure can be fabricated through a variation in the processing sequence depicted in FIGS. 4A-4F of the representative embodiments described in connection therewith. Notably, after the formation of the type $C_N$ piezoelectric seed layer 404 at FIG. 4B, the first electrode layer 403 is not patterned as described in connection with the processing sequence of FIG. 4D, but rather remains as a single layer. Instead, the type C piezoelectric seed layer 404 is patterned and removed from one side of the first electrode layer 403, as depicted in FIG. 4G.

Figure 4G:
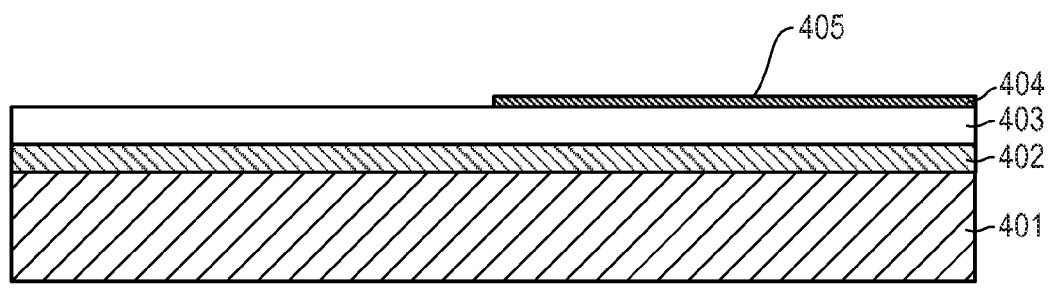

The structure depicted in FIG. 4G is provided in the piezoelectric deposition chamber, and hydrogen is flowed at a comparatively high rate (e.g., approximately 16 sccm to approximately 18 sccm) and hydrogen plasma is formed. The flow of hydrogen plasma functions as a cleaning sequence to remove oxides and other contaminants that can form over portion 405 of the type $C_N$ piezoelectric seed layer 404 and over the first electrode layer 403 during the process of patterning the type $C_N$ piezoelectric seed layer 404.

Figure 4H:
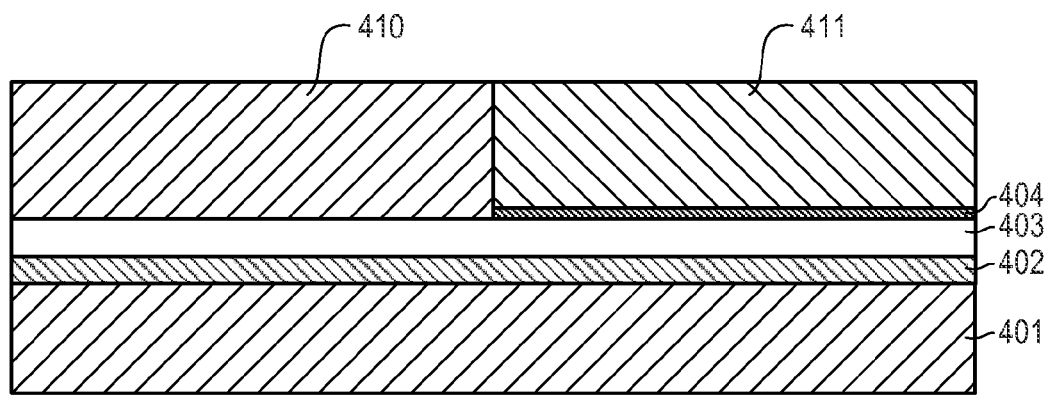

After the cleaning sequence is completed, the flow rate of hydrogen is reduced, and hydrogen plasma activates the portion 405 of the type $C_N$ piezoelectric seed layer 404 for growth of type $C_N$ piezoelectric material. Next, growth of the highly textured type $C_P$ piezoelectric material and highly textured type $C_N$ piezoelectric material is effected under conditions conducive to the growth of type $C_P$ piezoelectric material, as described in the parent application to Larson. Notably, the growth of the highly textured type $C_P$ piezoelectric material and highly textured type $C_N$ piezoelectric material occurs with the hydrogen flow continued at a comparatively low flow rate (e.g.; approximately 6 sccm to 8 sccm) to maintain growth of the type $C_N$ piezoelectric material. As depicted in FIG. 4H, the type $C_P$ piezoelectric layer 410 is formed immediately next to and in contact with type $C_N$ piezoelectric layer 411, with both type $C_P$ piezoelectric layer 410 and type $C_N$ piezoelectric layer 411 being formed over the first electrode layer 403.

Although not depicted in FIG. 4H, a second electrode layer is provided over the type $C_P$ piezoelectric layer 410 and the type $C_N$ piezoelectric layer 411.

The structure depicted in FIG. 4H may be referred to as a "p/ip" structure such as in the parent application to Burak, et al. The p/ip structure lends itself to improvements in performance in FBAR devices, SBAR devices and CRF devices, as is described in the parent application to Burak, et al. Notably, the process sequence to form the type $C_P$ piezoelectric layer 410 and the type $C_N$ piezoelectric layer 411 immediately next to one another and in contact with one another can be repeated to realize Op interfaces at other locations and levels of the selected acoustic stack for the desired BAW device.

It is again noted that certain known components of BAW resonator structures (e.g., acoustic reflectors, frame elements and other structures) are contemplated for inclusion in the BAW resonator devices fabricated according to the methods of the representative embodiments. These structures are fabricated according to known methods, and their fabrication is integrated into the overall process flow for fabricating the desired BAW resonator device including the methods of the representative embodiments.

In accordance with illustrative embodiments, methods of fabricating piezoelectric materials and acoustic resonators for various applications such as in electrical fitters are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A method, comprising:
providing a substrate;
forming a first piezoelectric layer having a compression-negative ($C_N$) polarity over the substrate; and
forming a second piezoelectric layer having a compression-positive ($C_P$) over the substrate and adjacent to the first piezoelectric layer, wherein the forming of the first piezoelectric layer and the forming of the second piezoelectric layer occurs substantially simultaneously.

2. A method as claimed in claim 1, further comprising, before forming the first piezoelectric layer and the second piezoelectric layer, forming a first electrode layer.

3. A method as claimed in claim 2, further comprising forming an electronegative layer over the first electrode.

4. A method as claimed in claim 3, further comprising removing the electronegative layer from a portion of the first electrode.

5. A method as claimed in claim 4, further comprising flowing hydrogen over the portion and over the electronegative layer.

6. A method as claimed in claim 5, further comprising forming the first piezoelectric layer over the portion of the first electrode and forming the second piezoelectric layer over the electronegative layer.

7. A method as claimed in claim 6, further comprising, reducing the flow rate of the hydrogen after beginning the forming of the first piezoelectric layer.

8. A method as claimed in claim 5, further comprising forming a seed layer of the first piezoelectric layer over the portion of the first electrode.

9. A method as claimed in claim 8, wherein a layer is formed over the electronegative layer, and the method further comprises removing the layer to expose the electronegative layer before the forming of the first piezoelectric layer and before the forming of the second piezoelectric layer.

10. A method as claimed in claim 9, wherein the forming of the first piezoelectric layer and the forming of the second piezoelectric layer occurs substantially simultaneously.

11. A method as claimed in claim 8, further comprising before the forming of the seed layer, flowing hydrogen over the portion and over the electronegative layer.

12. A method as claimed in claim 8, further comprising terminating the flow of hydrogen after beginning the forming of the first piezoelectric layer and the beginning of the forming of the second piezoelectric layer.

13. A method as claimed in claim 2, further comprising forming an electropositive surface over the first electrode.

14. A method as claimed in claim 13, further comprising removing the electropositive surface from a portion of the first electrode.

15. A method as claimed in claim 14, further comprising flowing hydrogen over the portion and over the portion and the electropositive surface.

16. A method as claimed in claim 15, further comprising forming the first piezoelectric layer over the electronegative layer and forming the second piezoelectric layer over the portion of the first electrode, wherein the forming of the first piezoelectric layer and the forming of the second piezoelectric layer occurs substantially simultaneously.

17. A method as claimed in claim 16, further comprising, after forming the electropositive surface, flowing hydrogen over the portion and over the electropositive surface.

18. A method as claimed in claim 17, further comprising reducing the flow of hydrogen after beginning the forming of the first piezoelectric layer and after beginning the forming of the second piezoelectric layer.

19. A method, comprising:
providing a seed layer useful in the growth of type-$C_P$ piezoelectric material over a portion of an electrode;
providing a seed layer useful in the growth of type-$C_N$ piezoelectric material is provided over another portion of the electrode;
growing an initial layer of type-$C_P$ piezoelectric material and an initial thickness of type-$C_N$ piezoelectric material over a common substrate;
removing the initial layer of the type-$C_P$ piezoelectric material; and
growing type-$C_P$ piezoelectric material and type-$C_N$ piezoelectric material substantially simultaneously over the substrate under conditions conducive to the formation of type $C_P$ piezoelectric material.

20. A method as claimed in claim 19, further comprising performing a cleaning step after the removing of the initial layer of the type-$C_P$ piezoelectric material.

21. A method, comprising:
providing a seed layer useful in the growth of type-$C_N$ piezoelectric material over a portion of an electrode;
activating the seed layer useful in the growth of type-$C_N$ piezoelectric material;
growing a type-$C_P$ piezoelectric material and a type-$C_N$ piezoelectric material substantially simultaneously in a chamber under conditions conducive to the formation of type-$C_P$ piezoelectric material.

* * * * *